United States Patent
Moriwaki

(10) Patent No.: US 7,396,734 B2
(45) Date of Patent: Jul. 8, 2008

(54) SUBSTRATE MANUFACTURING METHOD

(75) Inventor: Ryuji Moriwaki, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 259 days.

(21) Appl. No.: 11/139,567

(22) Filed: May 31, 2005

(65) Prior Publication Data

US 2005/0266653 A1 Dec. 1, 2005

(30) Foreign Application Priority Data

May 31, 2004 (JP) .............................. 2004-161566

(51) Int. Cl.
*H01L 21/46* (2006.01)
(52) U.S. Cl. ...................... 438/406; 438/455
(58) Field of Classification Search ................ 438/455, 438/406, 457, 458, 459
See application file for complete search history.

(56) References Cited

U.S. PATENT DOCUMENTS

| | | | | |
|---|---|---|---|---|
| 5,371,037 | A | 12/1994 | Yonehara | 437/86 |
| 5,374,564 | A | 12/1994 | Bruel | 437/24 |
| 5,451,547 | A * | 9/1995 | Himi et al. | 438/455 |
| 5,593,915 | A * | 1/1997 | Ohoka | 438/152 |
| 5,750,000 | A | 5/1998 | Yonehara et al. | 156/630.1 |
| 5,953,620 | A * | 9/1999 | Katou et al. | 438/406 |
| 6,150,031 | A | 11/2000 | Yonehara | 428/446 |
| 6,156,624 | A | 12/2000 | Yamagata et al. | 438/459 |
| 6,309,505 | B1 | 10/2001 | Takisawa et al. | 156/285 |
| 2002/0171080 | A1 * | 11/2002 | Faris | 257/40 |
| 2004/0020520 | A1 * | 2/2004 | Kim et al. | 134/95.2 |
| 2004/0259328 | A1 | 12/2004 | Ito et al. | 438/459 |

FOREIGN PATENT DOCUMENTS

| | | |
|---|---|---|
| JP | 5-21338 | 1/1993 |
| JP | 5-211128 | 8/1993 |
| JP | 7-249749 | 9/1995 |
| JP | 9-331049 | 12/1997 |
| JP | 10-256107 | 9/1998 |
| JP | 3294934 | 4/2002 |

OTHER PUBLICATIONS

M. Shimbo et al., "Silicon-to-Silicon Direct Bonding Method," 60(8) *J. Appl. Phys.* 2987-89 (Oct. 1986).
Takao Abe et al., "Silicon Wafer-Bonding Process Technology for SOI Structures," *Proceedings of the 4th International Symposium on Silicon-on-Insulator Technology and Devices*, May 6-11, 1990, Montreal, pp. 1-11.
G.G. Goetz, "Centralized Reaction Bonding," *Electrochemical Society, Bonding Symp.*, 1991, pp. 65-72.

* cited by examiner

*Primary Examiner*—Michael Trinh
(74) *Attorney, Agent, or Firm*—Fitzpatrick, Cella, Harper & Scinto

(57) ABSTRACT

In a method of manufacturing a bonded substrate stack by bonding the bonding surfaces of the first and second substrates, a bonding surface having a hydrophobic region and a hydrophilic region is formed by partially processing at least one of the bonding surfaces of the first and second substrates, and then the bonding surfaces of the first and second substrates are bonded to each other.

12 Claims, 14 Drawing Sheets

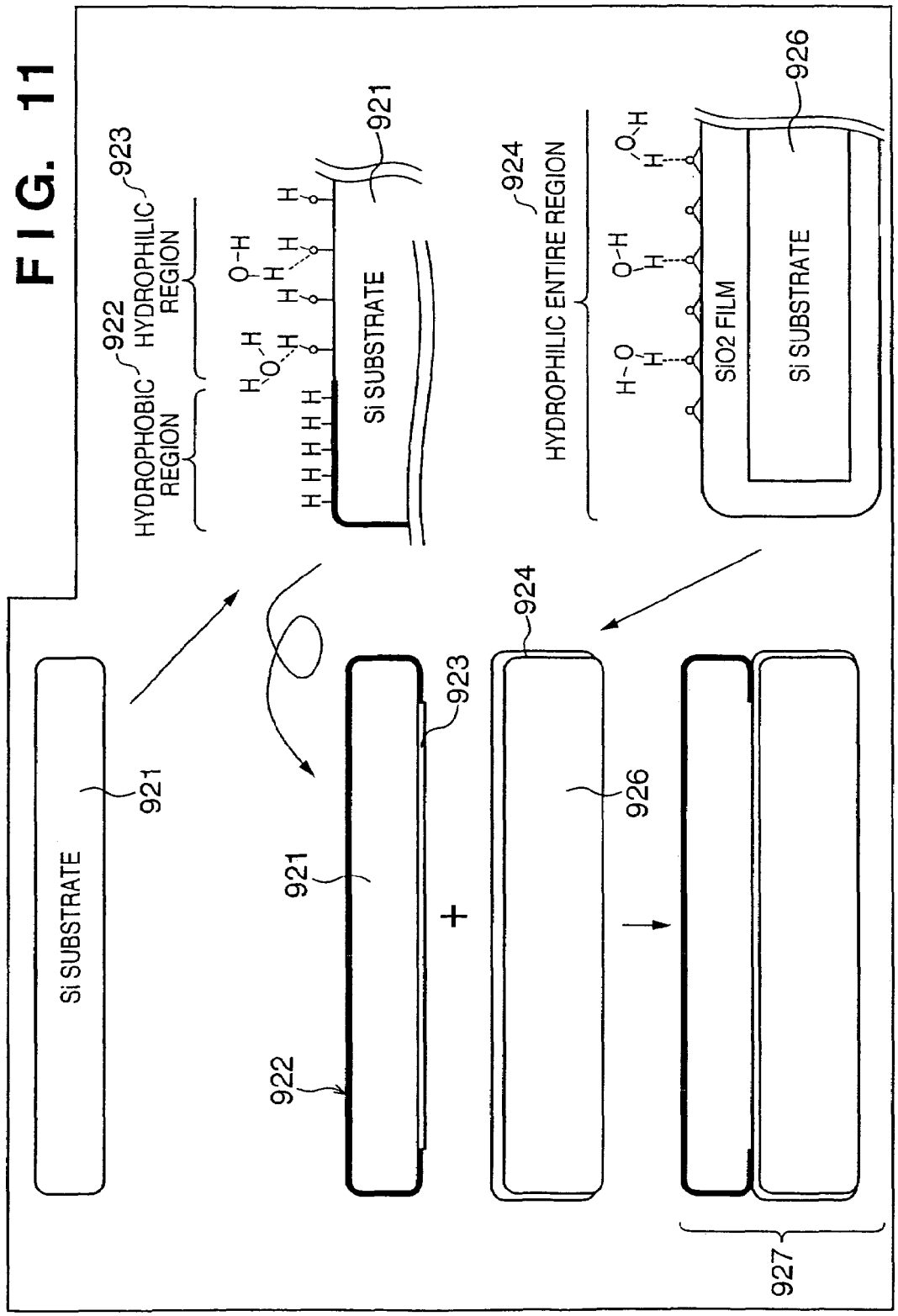

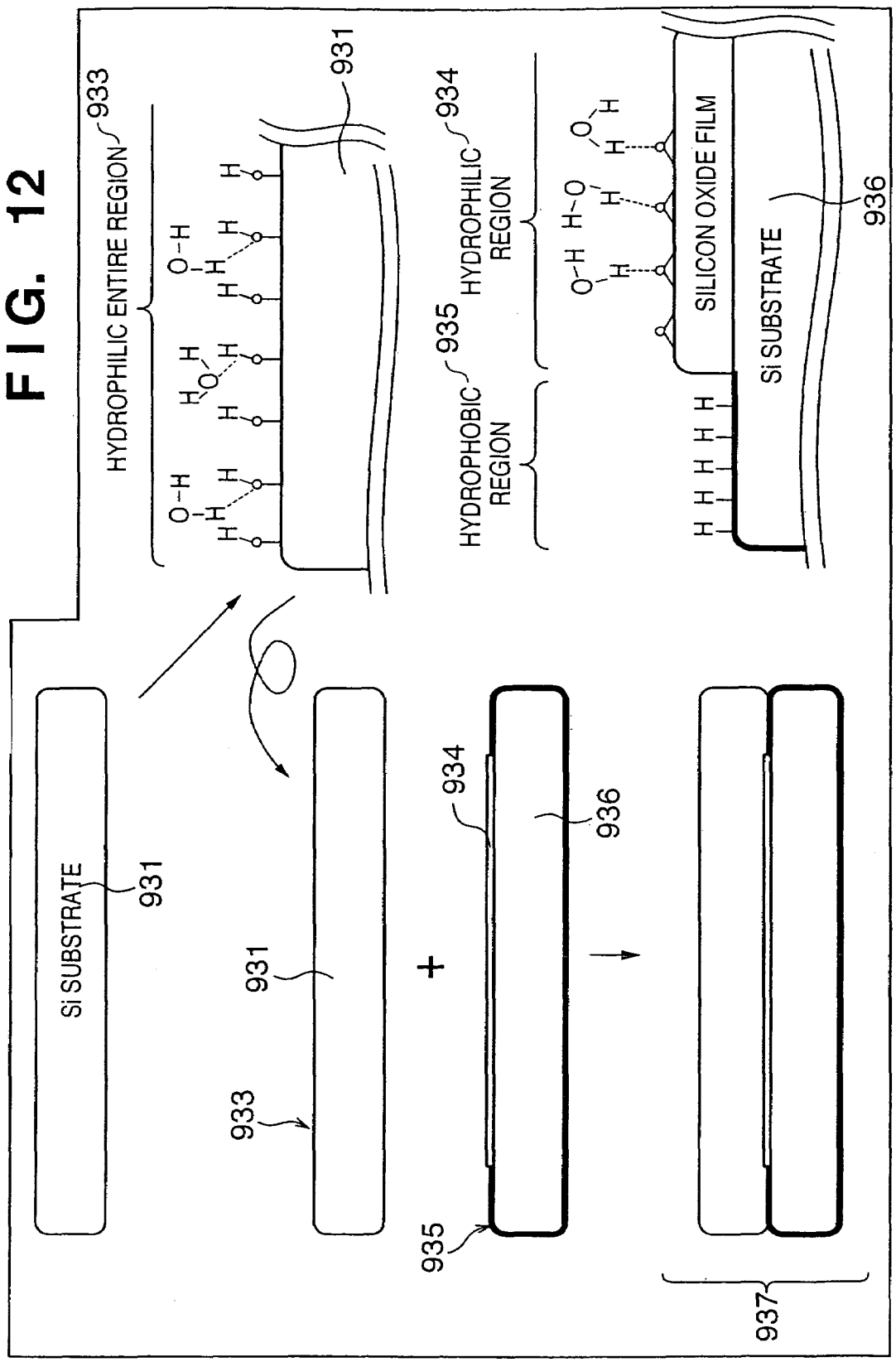

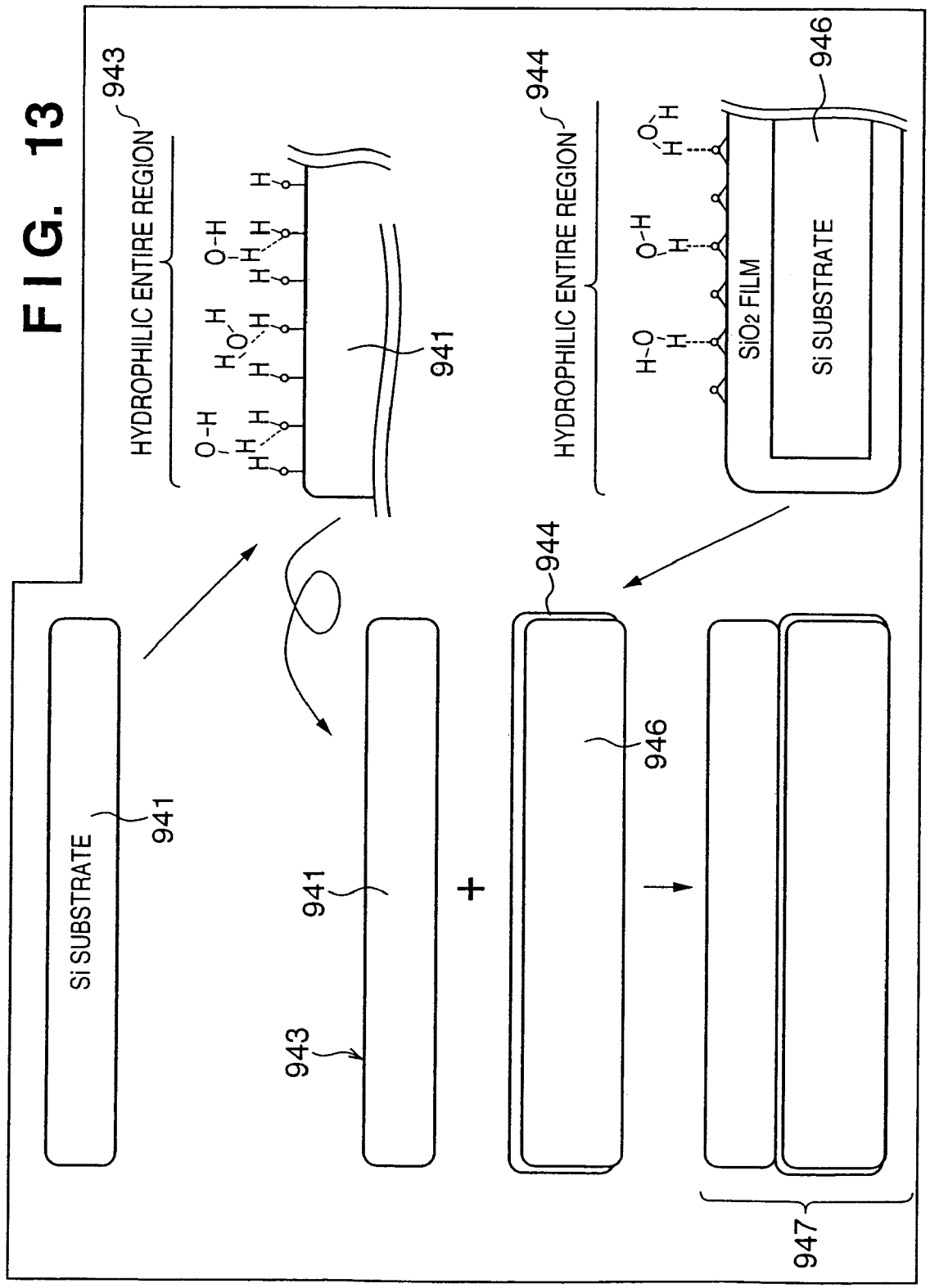

SUBSTRATE MANUFACTURING METHOD

FIELD OF THE INVENTION

The present invention relates to a substrate manufacturing method.

BACKGROUND OF THE INVENTION

Several methods of manufacturing an SOI substrate by bonding have been disclosed. Three representative methods will be described below.

In the first method, two substrates are bonded while inserting an oxide film between them. Polishing and grinding are performed from one side to leave a substrate having a desired thickness on the oxide film (see M. Shinbo, K. Furukawa, K. Fukuda and K. Tanazawa, J. Appl. Phys., vol. 60, p. 2987, 1986). Based on this technique, several methods of thinning a substrate portion with high controllability have been proposed.

The second method uses porous silicon (see Japanese Patent Laid-Open No. 5-21338). In this method (ELTRAN (registered trademark)), an epitaxial silicon layer grown on a porous silicon substrate is bonded to a support substrate while inserting an oxide film between them. After annealing is executed to increase the bonding strength, the structure is cleaved and split by an external force along stress in the porous silicon layer. The porous silicon layer remaining on the surface of the layer transferred to the support substrate side is selectively etched, thereby obtaining an SOI substrate. In this method, a similar SOI substrate can also be obtained by grinding the bonded substrate stack from the back surface on the porous layer formation side to expose the porous silicon layer and then selectively etching the porous layer.

The third method uses hydrogen ion implantation (see Japanese Patent Laid-Open No. 5-211128). In this method (Smart Cut (registered trademark)), an oxide film is formed on at least one of two silicon substrates. In addition, hydrogen ions or rare gas ions are implanted from the front surface of one silicon substrate to form a micro-bubble layer (enclosed layer) in the substrate. After that, the ion-implanted surface is bonded to the other silicon substrate (support substrate) while placing the oxide film between them. Annealing is executed to peel one substrate thin from the micro-bubble layer serving as a cleavage plane. Annealing (bonding annealing) is further executed to increase the bonding strength, thereby obtaining an SOI substrate.

The common problem of these bonded SOI substrate stack manufacturing methods is how to control the bonding surface between the substrates. In order to control the bonding surface, it is important to increase the bonding strength. As a technique of increasing the bonding strength, a hydrophilic process performed on a silicon surface side when the silicon surface is bonded to a silicon oxide surface has been proposed (see Proc. 4th International Symposium on Si on Insulator Technology and Devices, May 6-11, 1990, Moutread). A technique of further increasing the bonding strength by activating the bonding surface has also been proposed (see G.G. Goetz, Electrochemical Society, Bonding Symposium 1991, Extended Abstract p. 65, and Japanese Patent No. 3294934). Note that the surface also becomes hydrophilic in a method disclosed in G.G. Goetz, Electrochemical Society, Bonding Symposium 1991, Extended Abstract p. 65, and Japanese Patent No. 3294934.

When water (physical adsorbed water, chemical bonding water, and the like) is excessively present on the bonding surface, the excessive water is trapped at the periphery of the substrate in a bonding process. This causes small voids (spaces) at the periphery, thus posing a problem. As a means for solving this problem, a method of making the silicon surface hydrophobic when the silicon surface is bonded to the silicon oxide film surface has been proposed (see Japanese Patent Laid-Open No. 9-331049).

If the silicon surface is hydrophilic when the silicon surface is bonded to the silicon oxide film surface, a high bonding strength can be obtained. Hence, a sufficient bonding strength can be advantageously obtained by annealing at a relatively low temperature in the annealing process after bonding. However, in this case, the voids caused by the excessive amount of the adsorbed water on the surface tend to be formed at the periphery of the bonding surface.

When the silicon surface is hydrophobic, no void is formed at the periphery of the substrate, advantageously. However, since the high bonding strength cannot be obtained, the annealing temperature must be set to be relatively high after bonding.

SUMMARY OF THE INVENTION

The present invention has been made in consideration of the above problem, and has as its object to provide a technique of forming a bonded substrate stack with a sufficiently high bonding strength without any voids.

In the present invention, there is provided a substrate manufacturing method of manufacturing a bonded substrate stack by bonding a bonding surface of a first substrate and a bonding surface of a second substrate, characterized by comprising steps of forming a bonding surface having a hydrophobic region and a hydrophilic region by partially processing at least one of the bonding surface of the first substrate and the bonding surface of the second substrate, and bonding the bonding surface of the first substrate and the bonding surface of the second substrate.

In the present invention, a bonded substrate stack with high bonding strength can be obtained without any voids.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a view showing the first method of manufacturing a bonded substrate stack by making the periphery of the silicon substrate hydrophobic;

FIG. 12 is a view showing the second method of manufacturing the bonded substrate stack by making the periphery of the silicon substrate hydrophobic;

FIG. 13 is a view showing the conventional method of manufacturing the bonded substrate stack by bonding hydrophilic surfaces.

DETAILED DESCRIPTION OF THE PREFERRED EMBODIMENT

Figure 1A:
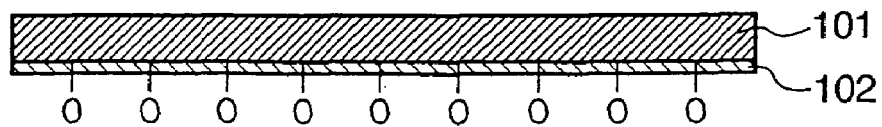
FIGS. 1A to 1E show a substrate manufacturing method according to a preferred embodiment of the present invention.

As a technique of increasing a bonding strength, a hydrophilic process performed on a silicon surface side when the silicon surface is bonded to a silicon oxide surface has been proposed. The surface (to be referred to as a "hydrophilic surface" hereinafter) subjected to the hydrophilic process is terminated with a hydrophilic group such as O or OH (see reference numerals 923 and 924 in FIG. 11). Alternatively, the surface (to be referred to as a "hydrophobic surface" hereinafter) subjected to a hydrophobic process is terminated with H, F, Si, or the like (see reference numeral 922 in FIG. 11). Hence, bonding water is almost absent on the hydrophobic surface.

Figure 8:
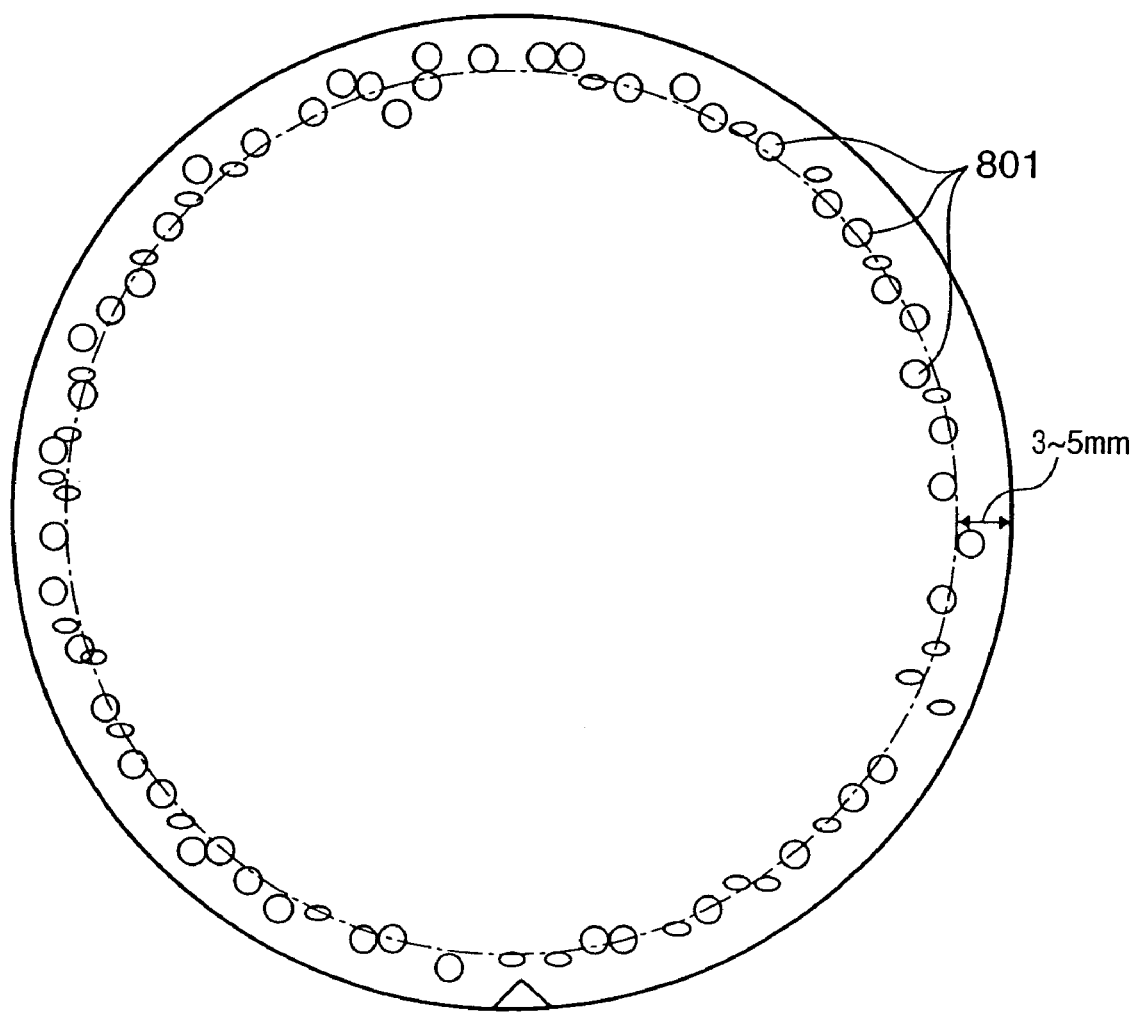
FIG. 8 is a view schematically showing voids localized at the periphery of a wafer.

Since the excessive amount of water is present on a hydrophilic substrate surface terminated with the hydrophilic group, the water at the periphery of the substrate is not pushed out of the substrate, but is trapped. As a result, a number of voids (spaces) 801 shown in FIG. 8 are formed on a bonding interface at the periphery of the substrate, thus posing a problem.

When the silicon surfaces are bonded to each other at room temperature, the bonding energy (bonding strength) between the hydrophilic surfaces is 10 [erg/cm$^2$], and that between the hydrophobic surfaces is 150 [erg/cm$^2$], i.e., the bonding energy between the hydrophobic surfaces is 15 times that between the hydrophilic surfaces. These bonding energies are assumed to pertain to a bonding reaction rate (for example, a bonding rate obtained when stacking, locally pressing, and sequentially bonding the substrates in an apparatus disclosed in Japanese Patent Laid-Open No. 10-256107). Actually, in a 200-cm silicon substrate, a bonding time (time from the start of the bonding reaction on one terminal to the end of the bonding on the opposite terminal) of the hydrophobic surface is 180 sec, and that of the hydrophilic surface is 10 sec, i.e., these bonding times are largely different from each other. That is, since the hydrophilic surfaces are bonded at an excessively high rate, the hydrophilic substrates are progressively bonded to each other before the water is pushed out of the substrate, thus leaving the water between the substrates.

Figure 14A:
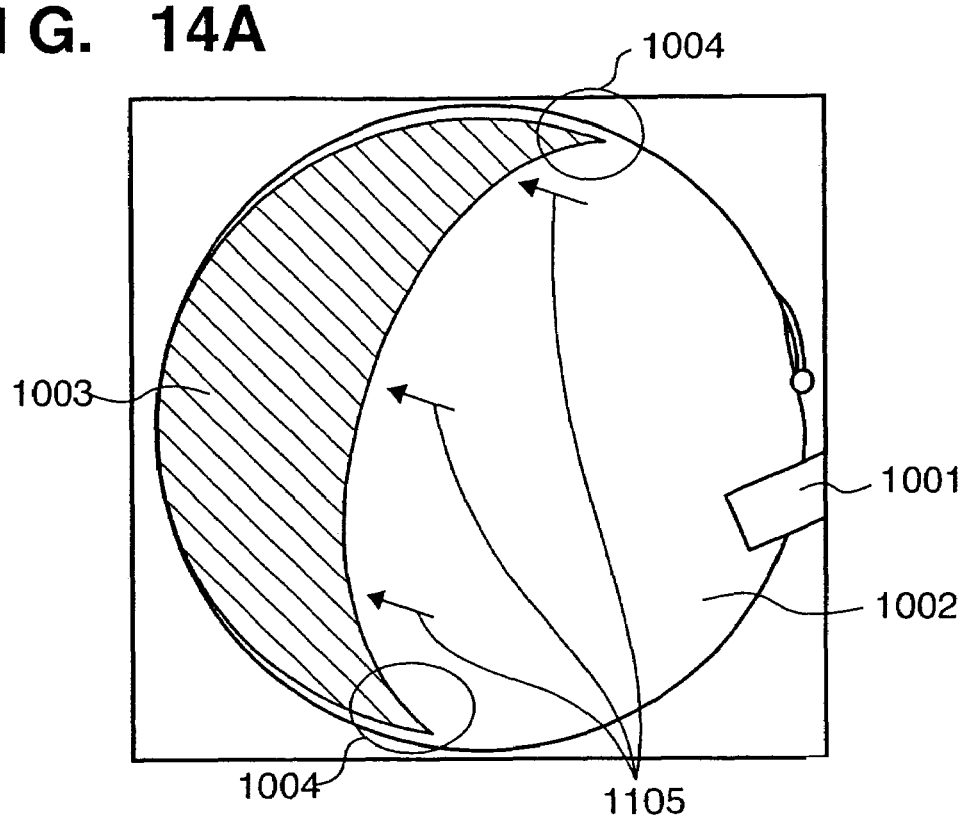
FIGS. 14A and 14B are views showing an infrared transmission photograph obtained by infrared transmission and observation of a reaction situation during a bonding reaction.

On the basis of the above result, an attempt is made to bond the unbonded silicon substrates by using the peripheries serving as hydrophobic surfaces. FIG. 14A is a view showing an infrared camera photograph obtained by infrared transmission and observation of a reaction situation during the bonding reaction of the silicon substrate having the periphery serving as the hydrophobic surface. In FIG. 14A, a pressing pin 1001 presses a silicon substrate 1002. Water 1003 gradually moves outward from the silicon substrate 1002, and a bonding portion 1005 between the substrates is extended. Since a periphery 1004 of the silicon substrate 1002 is hydrophobic, the bonding reaction rate at a periphery 1004 is extremely lower than that at a central portion.

Figure 14B:
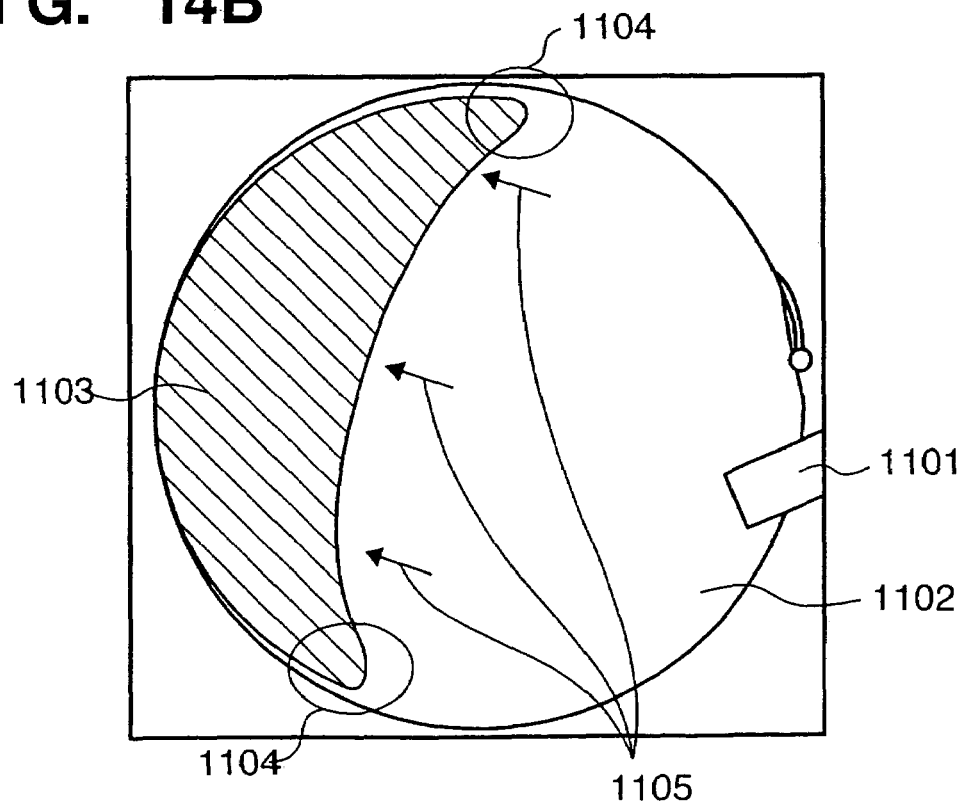

Alternatively, FIG. 14B is a view showing an infrared camera photograph obtained by infrared transmission and observation of a reaction situation during the bonding reaction of a silicon substrate 1102 having a entire surface serving as the hydrophilic surface. In FIG. 14B, a pressing pin 1101 presses a silicon substrate 1102. Water 1103 gradually moves outward from the silicon substrate 1102, and a bonding portion 1105 between the substrates is extended. Since the entire surface of the silicon substrate 1102 is hydrophilic, the bonding reaction rate at a periphery 1104 is not extremely lower than that at a central portion.

When observing the voids on the substrate manufactured in the above method, the peripheral voids 801 as shown in FIG. 8 are not found on the silicon substrate with the periphery serving as the hydrophobic surface. Alternatively, the peripheral voids 801 as shown in FIG. 8 are found on the silicon substrate 1102 with the entire surface serving as the hydrophilic surface.

On the basis of these experiments, the present inventor has found that the periphery of the unbonded silicon substrate advantageously serves as the hydrophobic surface in order to implement a bonded structure wherein the water is not trapped at the periphery while keeping the bonding strength between the hydrophilic surfaces.

Figure 9A:
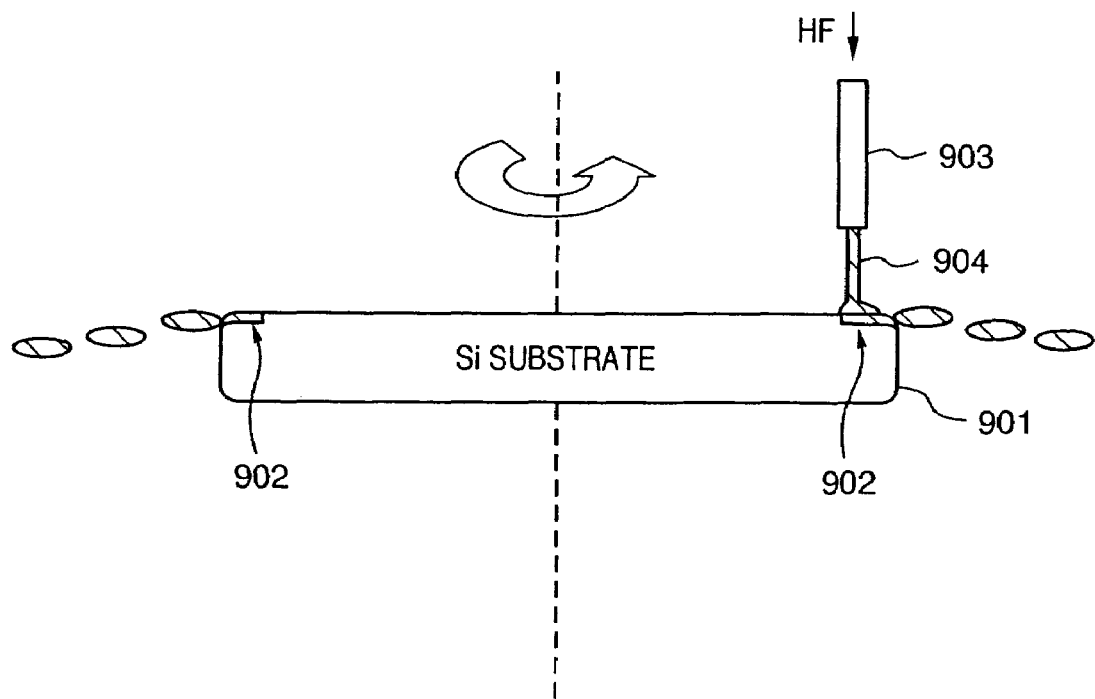
FIGS. 9A and 9B are views showing a method of making the periphery of a silicon substrate hydrophobic according to the preferred embodiment of the present invention.

Several methods of making the periphery of the silicon substrate hydrophobic are available. FIG. 9A is a view schematically showing the first method of making the periphery of the silicon substrate hydrophobic. A silicon substrate 901 which has an oxide film on the surface, or is cleaned (to be referred to "hydrophilic cleaning" hereinafter) to obtain the hydrophilic surface is rotated. At the same time, an HF solution 904 is supplied from a nozzle 903 arranged at a periphery 902 of the silicon substrate 901. With this process, the periphery 902 of the silicon substrate 901 can be hydrophobic. In this case, since the position of the nozzle 903 for supplying the HF solution 904 is controlled, the width of the periphery 902 on the hydrophobic surface of the silicon substrate 901 can be controlled. Note that, when the silicon substrate 901 which has the oxide film is used, the oxide film at the periphery 902 must be removed to expose the silicon surface.

Figure 9B:
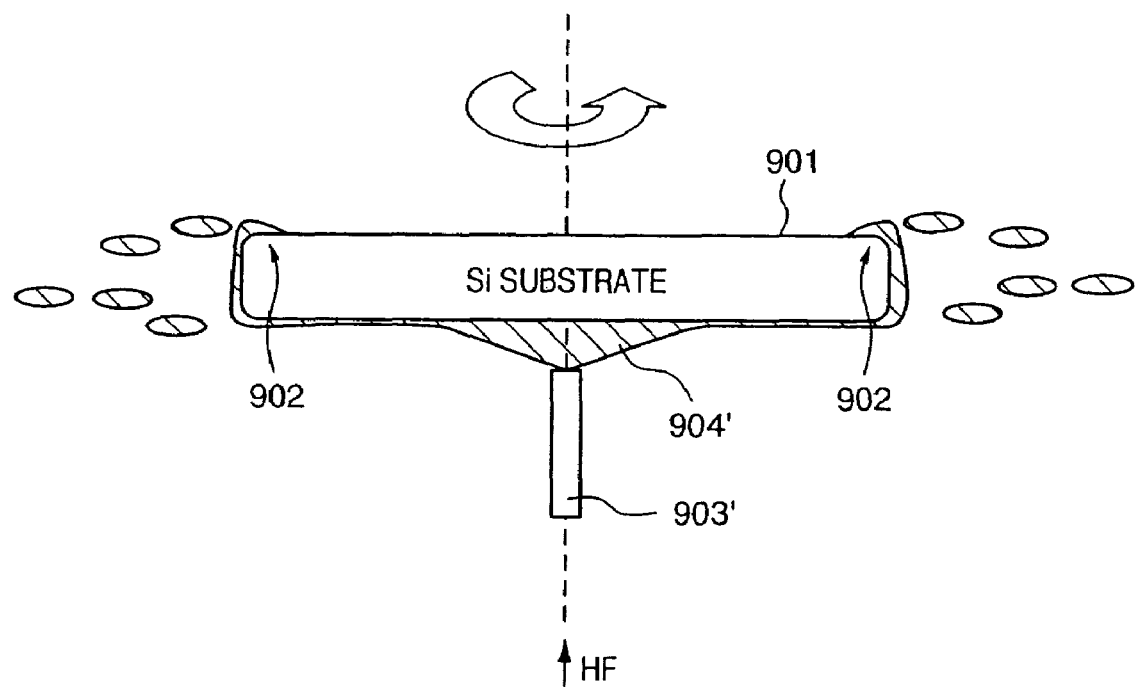

FIG. 9B is a view schematically showing the second method of making the periphery of the silicon substrate hydrophobic. As in the first method described above, an HF solution 904' is sprayed from a nozzle 903' facing the back surface of the silicon substrate 901. Hence, the HF solution 904' reaches the front surface from the terminal of the silicon substrate 901 to etch the oxide film or hydrophilic group at the periphery 902 on the surface of the silicon substrate 901. In this case, the rotational speed of the silicon substrate 901 is controlled to control the width of the periphery 902 on the hydrophobic surface of the silicon substrate 901.

Figure 10:
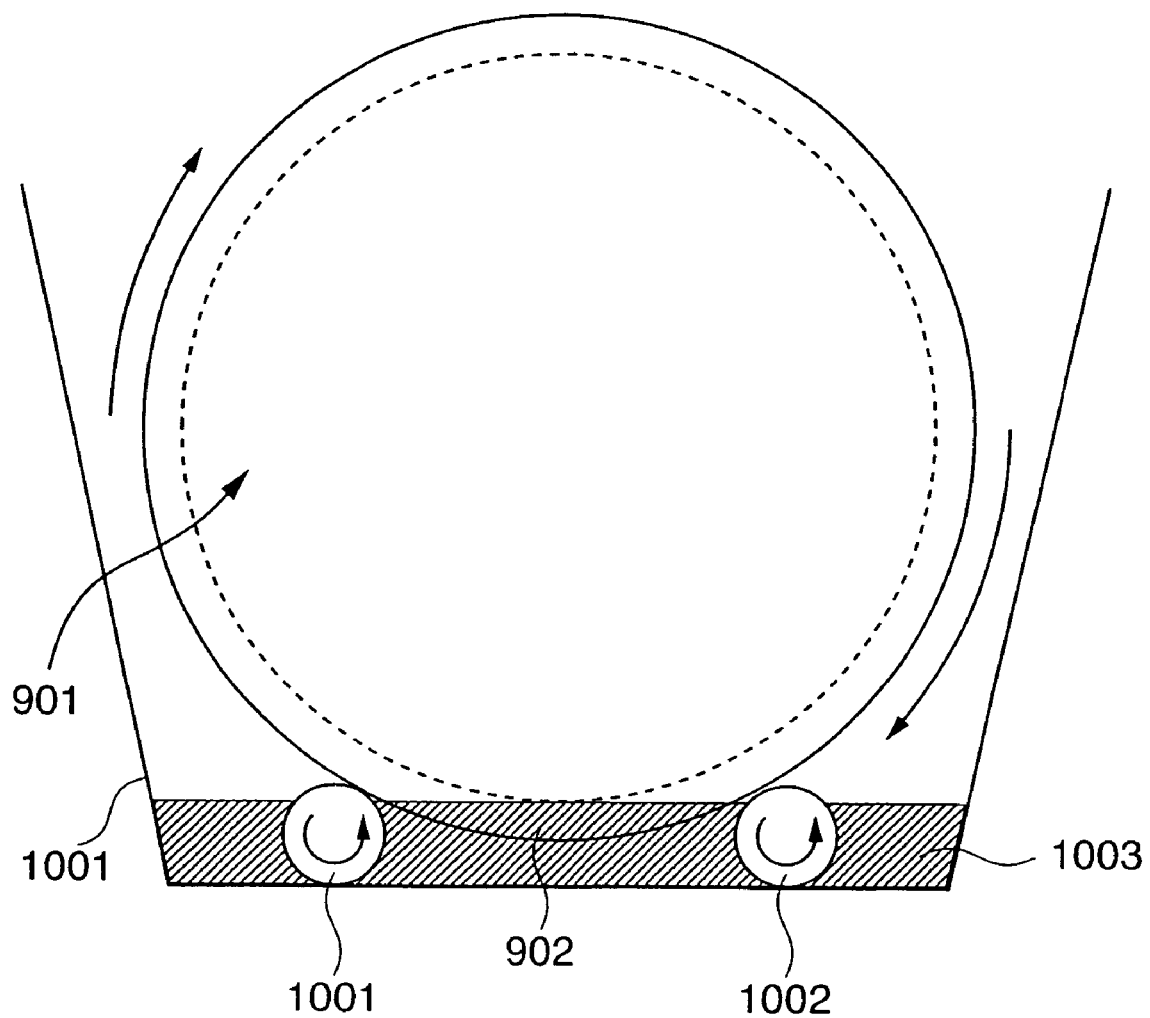
FIG. 10 is a view showing another method of making the periphery of the silicon substrate hydrophobic according to the preferred embodiment of the present invention.

FIG. 10 is a view schematically showing the third method of making the periphery of the silicon substrate hydrophobic. The silicon substrate 901 is placed almost vertically on wafer rotating rollers 1002 in a chemical solution tank 1001. The wafer rotating rollers 1002 have a groove to support the silicon substrate 901. When the wafer rotating rollers 1002 rotate, the silicon substrate 901 rotates. An HF solution 1003 such as an HF solution to etch the oxide film or hydrophilic group is supplied into the chemical solution tank 1001. The HF solution 1003 is supplied so that the periphery 120 of the silicon substrate 901 is barely dipped in it.

To prevent the HF solution 1003 from reaching parts except the periphery 920 of the silicon substrate 901 during rotation of the silicon substrate 901, for example, the following two methods are available. In the first method, for example, the HF solution 1003 with a high etching selectivity between the silicon substrate 901 and the oxide film is used, and the rotational speed of the silicon substrate 901 is reduced as much as possible (e.g., 1 revolution per hr). Since the oxide film is completely etched, overetching causes no problem. More specifically, since the etching selectivity between the silicon substrate 901 and the oxide film is high, the silicon substrate 901 is rarely etched. In the second method, a cover rinse such as pure water is sprayed to the central portion of the surface of the silicon substrate 901. At the same time, the HF solution 1003 is supplied to the chemical solution tank 1001 to prevent dilution of the HF solution 1003. In this case, since the oxide film is completely etched, the concentration of the HF solution 1003 is rarely influenced.

When the periphery 902 of the silicon substrate 901 is dipped in the HF solution 1003, and the silicon substrate 901 is rotated, the oxide film or hydrophilic group at the periphery 902 of the silicon substrate 901 can be etched.

Note that the method of making the periphery of the silicon substrate hydrophobic is not limited to the above methods. For example, while the silicon substrate rotates, an etching gas such as fluorine-based gas is supplied to the periphery of the silicon substrate. Simultaneously, an inert gas such as $N_2$ is supplied from a nozzle to the central portion of the silicon substrate. In this case, when the etching gas is supplied to the periphery of the silicon substrate while supplying the inert gas to the central portion of the silicon substrate 901, the central portion of the silicon substrate can be prevented from being etched by the etching gas. A mask may be arranged at the central portion (region except the periphery) of the silicon substrate, and the HF solution is supplied to the periphery of the silicon substrate outside the mask, thereby etching the oxide film or hydrophilic group at the periphery of the surface of the silicon substrate.

In these methods as described above, a representative example of manufacturing a bonded SOI substrate stack by using the hydrophobic periphery of the silicon substrate will be described with reference to FIGS. 11 and 12. The conventional example for manufacturing the bonded SOI substrate stack by bonding the hydrophilic surfaces without any hydrophobic regions at the periphery will be described with reference to FIG. 13.

FIG. 11 is a view showing the first method of manufacturing the bonded SOI substrate stack by using the hydrophobic periphery of the silicon substrate. As shown in FIG. 11, a silicon substrate 921 having a hydrophilic surface by hydrophilic cleaning is prepared. Next, in a method shown in FIGS. 9A and 9B, the hydrophilic group at a 2-mm wide periphery of the silicon substrate 921 is etched to form a hydrophobic region 922 and hydrophilic region 923 on the surface of the silicon substrate 921. A silicon substrate 926 on which the oxide film is formed by thermal oxidation is prepared. The entire surface of this silicon substrate 926 is a hydrophilic region 924. After that, the mirror faces of the two silicon substrates 921 and 926 are bonded to manufacture a bonded substrate stack 927. FIG. 14A shows an infrared camera photograph obtained by infrared transmission and observation of the reaction situation during the bonding reaction. In FIG. 14A, the bonding reaction rate decreases at the periphery 1004 serving as the hydrophobic region 922 of the silicon substrate.

FIG. 12 is a view showing the second method of manufacturing the bonded SOI substrate stack by using the hydrophobic periphery of the silicon substrate. As shown in FIG. 12, a silicon substrate 931 having an entire surface as a hydrophilic surface 933 by hydrophilic cleaning is prepared. A silicon substrate 936 on which the oxide film is formed by thermal oxidation is prepared. Next, in a method as described above, the oxide film at a 2-mm wide periphery of the silicon substrate 931 on which the oxide film is formed is etched to form a hydrophobic region 935. Since a remaining portion is a silicon oxide film, the remaining portion serves as a hydrophilic region 934. After that, the mirror faces of the two silicon substrates 931 and 936 are bonded to manufacture a bonded substrate stack 937.

FIG. 13 is a view showing the conventional method of manufacturing the bonded SOI substrate stack by bonding the hydrophilic surfaces. As shown in FIG. 13, a silicon substrate 941 having an entire surface as a hydrophilic surface 943 by hydrophilic cleaning is prepared. A silicon substrate 946 on which the oxide film is formed by thermal oxidation is prepared. The entire surface of this silicon substrate 946 serves as a hydrophilic region 944. After that, the mirror faces of the two silicon substrates 941 and 946 are bonded to manufacture a bonded substrate stack 947. FIG. 14B shows an infrared camera photograph obtained by infrared transmission an observation of the reaction situation during the bonding reaction. In FIG. 14B, the bonding reaction rate does not excessively decrease even at the periphery 1104 of the silicon substrate 1102.

As described above, in FIG. 14A, the bonding reaction rate at the periphery 1004 is lower than that at the central portion 1005. Hence, the water 1003 is pushed out of the silicon substrate to prevent the voids from being formed at the periphery 1004. Alternatively, in FIG. 14B, the water 1103 is not sufficiently pushed out, thereby trapping the water at the periphery 1104.

Next, annealing is executed at 800° C. to 1,000° C. on the bonding substrate stacks 927, 937, and 947. When the silicon substrate undergoes infrared transmission and observation with the infrared camera after annealing, uncountable voids (reference numeral 801 in FIG. 8) each having a depth of several hundred μm are formed at a 3- to 5-mm wide periphery of only the silicon substrate stack 947 (FIG. 13) formed by bonding the peripheries which are not hydrophobic. To the contrary, on the silicon substrate stacks 927 and 937 (FIGS. 11 and 12) formed by bonding the hydrophobic peripheries on one side of the silicon substrate, no voids are formed at their peripheries.

As described above, since the hydrophobic regions at the peripheries of the substrates are formed and bonded to each other, the bonded substrate stack with high bonding strength can be obtained without any voids. Note that, in this embodiment, the hydrophobic region is formed at the periphery of the substrate on which the voids are conspicuously formed. However, the present invention is not limited to this. For example, the region serving as the hydrophobic surface may be formed in the portion except the periphery of the substrate, in accordance with the region having the voids.

The present invention will be described below on the basis of examples. However, the present invention is not limited to these examples.

EXAMPLE 1

FIGS. 1A to 1E are sectional views for explaining the steps in Example 1 of an SOI substrate manufacturing method according to this embodiment.

A silicon substrate 101 having a thickness of 725 µm was prepared. Thermal oxidation was executed to form a 75-nm thick $SiO_2$ layer 102 on the surface (FIG. 1A).

Figure 1B:
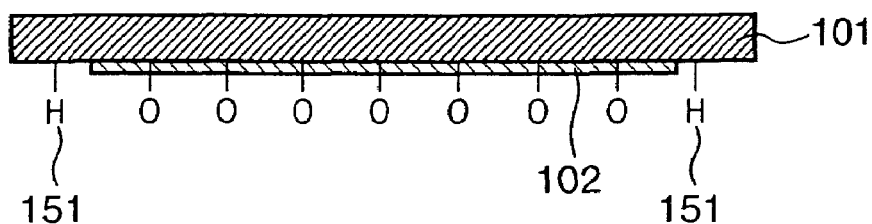

A periphery 151 of the $SiO_2$ film 102 was etched by a 0.7% hydrofluoric acid solution for 10 min, and the surface of the silicon substrate 101 was exposed at the periphery 151 (at a 2-mm wide periphery in this example) to form the region 151 serving as the hydrophobic surface (FIG. 1B).

Figure 1C:
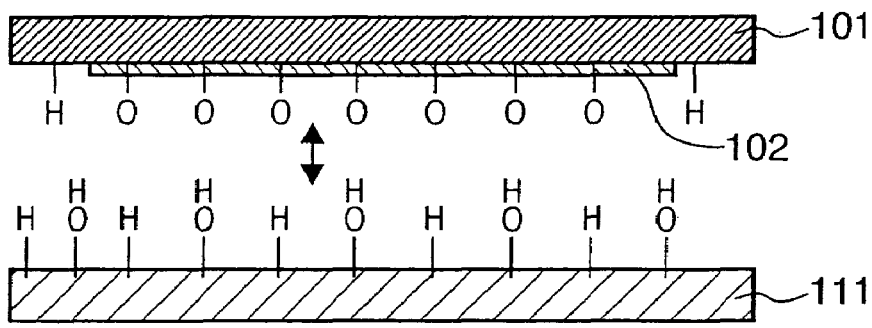

The silicon substrate 101 was bonded to a silicon substrate 111. Since the periphery 151 is a hydrophobic surface, the substrates could be bonded without any voids at the periphery 151 (FIG. 1C).

Figure 1D:
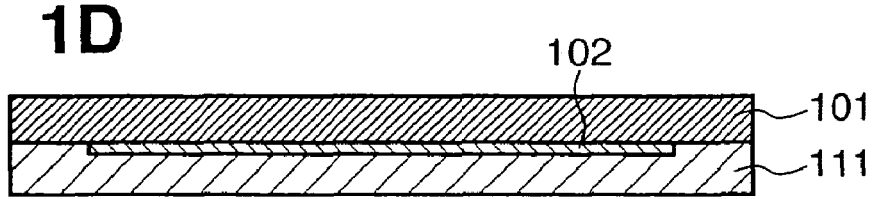

Annealing was executed at 1,000° C. for 130 min to completely bond the silicon substrates 101 and 111 (FIG. 1D).

Figure 1E:
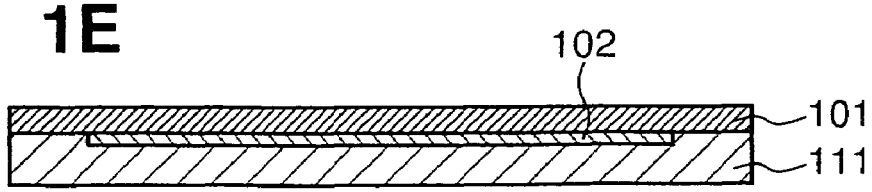

The surface on the side of the silicon substrate 101 was ground 715 µm by using a surface grinder. Next, mirror polishing was executed by using colloidal silica as abrasive grain. An SOI substrate was obtained while leaving the silicon film 101 having a thickness of 2 µm on the $SiO_2$ layer 102. As a result, the SOI substrate could be obtained without any voids at the periphery 151 (FIG. 1E).

EXAMPLE 2

FIGS. 2A to 2E are sectional views for explaining the steps in Example 2 of an SOI substrate manufacturing method according to this embodiment.

Figure 2A:
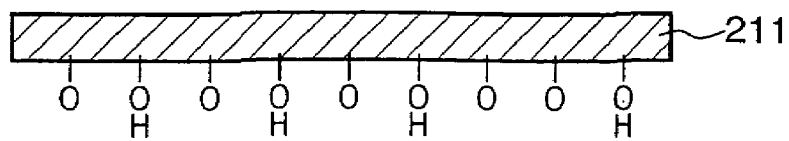
FIGS. 2A to 2E show another substrate manufacturing method according to the preferred embodiment of the present invention.
Figure 2B:
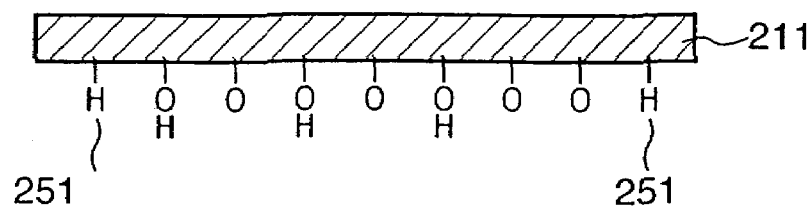

A 725-µm thick silicon substrate 211 whose entire surface was hydrophilic by the hydrophilic cleaning was prepared (FIG. 2A). A periphery 251 was etched by a 0.7% hydrofluoric acid solution for 10 min, and the periphery 251 (at a 2-mm wide periphery in this example) was made as the hydrophobic surface (FIG. 2B).

Figure 2C:
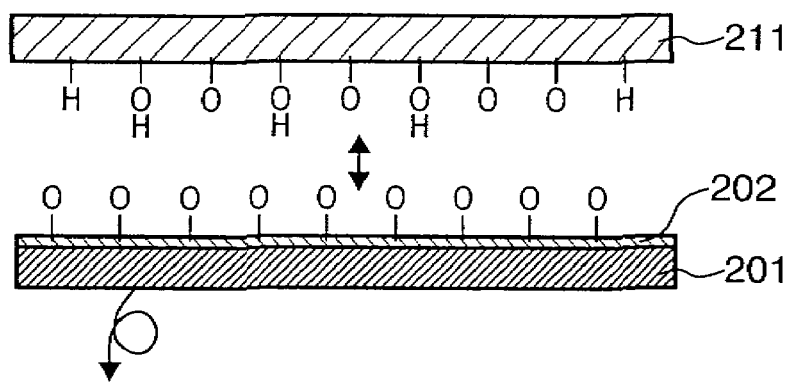

A silicon substrate 201 having a thickness of 725 µm was prepared. Thermal oxidation was executed to form a 75-nm thick $SiO_2$ layer 202 on the surface. The silicon substrates 201 and 211 were bonded to each other. Since the periphery 251 of the silicon substrate 211 is a hydrophobic surface, the substrates could be bonded without any voids at the periphery 251 (FIG. 2C).

Figure 2D:
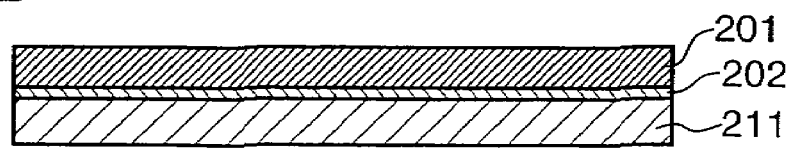

Annealing was executed at 1,000° C. for 130 min to completely bond the silicon substrates 201 and 211 (FIG. 2D).

Figure 2E:
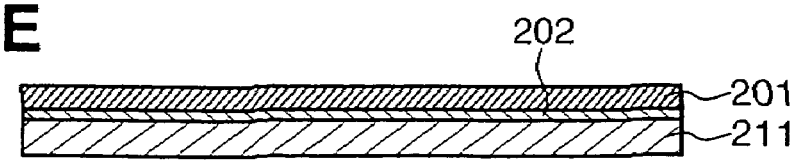

The surface on the side of the silicon substrate 201 was ground 715 µm by using a surface grinder. Next, mirror polishing was executed by using colloidal silica as abrasive grain. An SOI substrate was obtained while leaving the silicon film 201 having a thickness of 2 µm on the $SiO_2$ layer 202. As a result, the SOI substrate could be obtained without any voids at the periphery 251 (FIG. 2E).

EXAMPLE 3

FIGS. 3A to 3F are sectional views for explaining the steps in Example 3 of an SOI substrate manufacturing method according to this embodiment.

Figure 3A:
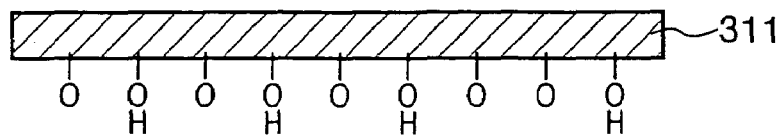
FIGS. 3A to 3F show still another substrate manufacturing method according to the preferred embodiment of the present invention.
Figure 3B:
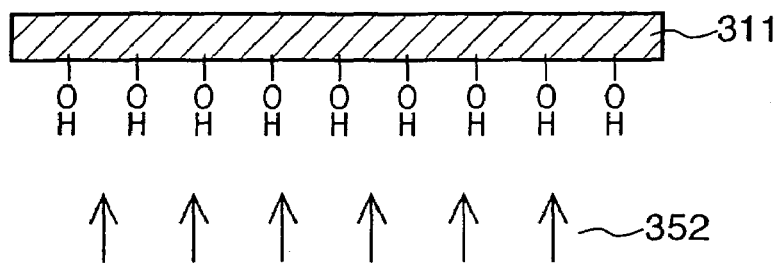
Figure 3C:
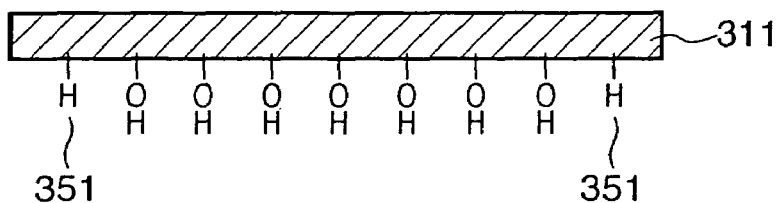

A silicon substrate 311 was prepared, and an activation process 352 was performed on the surface of a silicon substrate 311 (FIG. 3B). After that, a periphery 351 was etched by a 0.7% hydrofluoric acid solution for 10 min, and the periphery 351 (at a 2-mm wide periphery in this embodiment) was made as the hydrophobic surface (FIG. 3C).

Figure 3D:
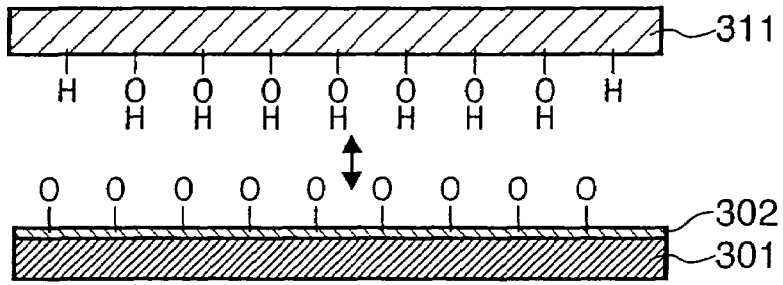

A silicon substrate 301 having a thickness of 725 µm was prepared. Thermal oxidation was executed to form a 75-nm thick $SiO_2$ layer 302 on the surface. The silicon substrates 301 and 311 were bonded to each other. Since the periphery 351 of the silicon substrate 311 is a hydrophobic surface, the substrates could be bonded without any voids at the periphery 351 (FIG. 3D).

Figure 3E:
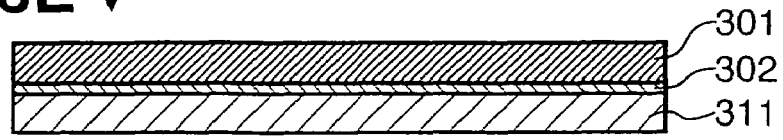

Annealing was executed at 1,000° C. for 130 min to completely bond the silicon substrates 301 and 311 (FIG. 3E).

Figure 3F:
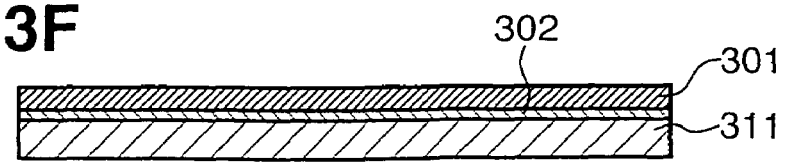

The surface on the side of the silicon substrate 301 was ground 715 µm by using a surface grinder. Next, mirror polishing was executed by using colloidal silica as abrasive grain. An SOI substrate was obtained while leaving the silicon film 301 having a thickness of 2 µm on the $SiO_2$ layer 302. As a result, the SOI substrate could be obtained without any voids at the periphery 351 (FIG. 3F).

EXAMPLE 4

FIGS. 4A to 4E are sectional views for explaining the steps in Example 4 of an SOI substrate manufacturing method according to this embodiment.

Figure 4A:
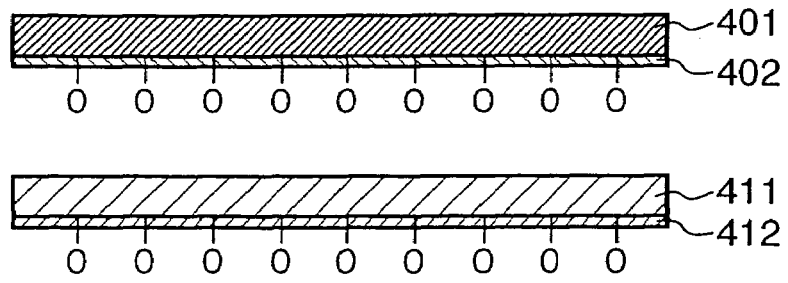
FIGS. 4A to 4E show still another substrate manufacturing method according to the preferred embodiment of the present invention.

Two silicon substrates 401 and 411 each having a thickness of 725 µm were prepared. Thermal oxidation was executed to form 75-nm thick $SiO_2$ layers 402 and 412 on the surface (FIG. 4A).

Figure 4B:
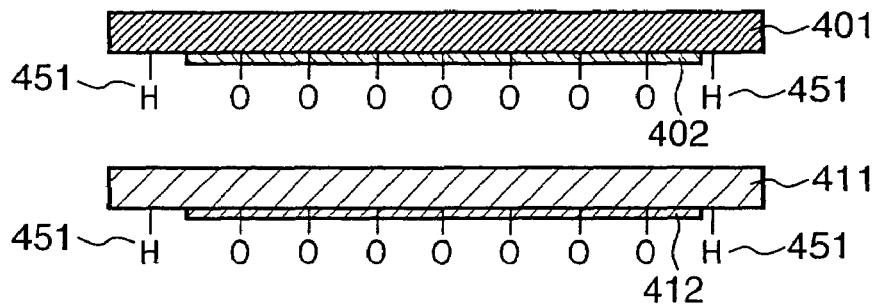

A periphery 451 of each of the $SiO_2$ films 402 and 412 was etched by a 0.7% hydrofluoric acid solution for 10 min, and the surface of the silicon substrates 401 and 411 were exposed at the periphery 451 (at a 2-mm wide periphery in this example) to form the region 451 serving as the hydrophobic surface (FIG. 4B).

Figure 4C:
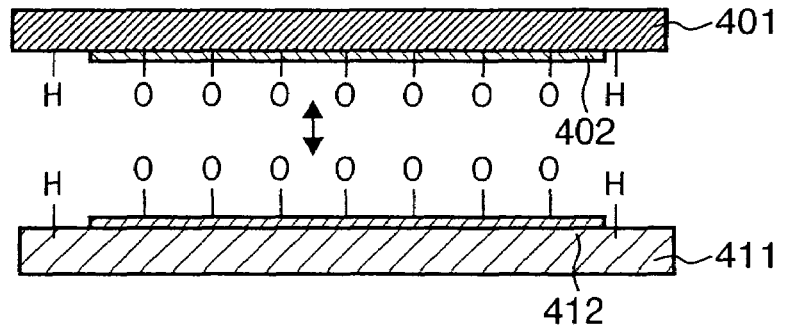

The substrates were bonded to each other. Since the periphery 451 was a hydrophobic surface, the substrates could be bonded without any voids at the periphery 451 (FIG. 4C).

Figure 4D:
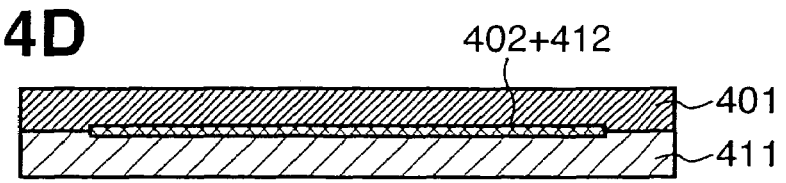

Annealing was executed at 1,000° C. for 130 min to completely bond the silicon substrates 401 and 411 (FIG. 4D).

Figure 4E:
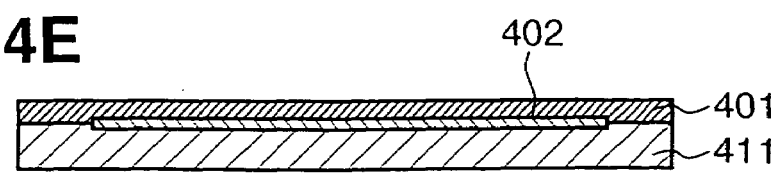

The surface on the side of the silicon substrate 401 was ground 715 µm by using a surface grinder. Next, mirror polishing was executed by using colloidal silica as abrasive grain. An SOI substrate was obtained while leaving the silicon film 401 having a thickness of 2 µm on the $SiO_2$ layers 402 and 412. As a result, the SOI substrate could be obtained without any voids at the periphery 451 (FIG. 4E).

EXAMPLE 5

FIGS. 5A to 5F are sectional views for explaining the steps in Example 5 of an SOI substrate manufacturing method according to this embodiment.

Figure 5A:
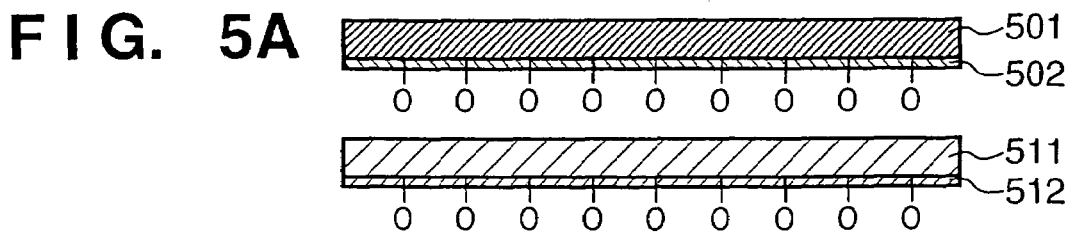
FIGS. 5A to 5F show still another substrate manufacturing method according to the preferred embodiment of the present invention.

Two silicon substrates 501 and 511 each having a thickness of 725 µm were prepared. Thermal oxidation was executed to form 75-nm thick $SiO_2$ layers 502 and 512 on the surface (FIG. 5A).

Figure 5B:
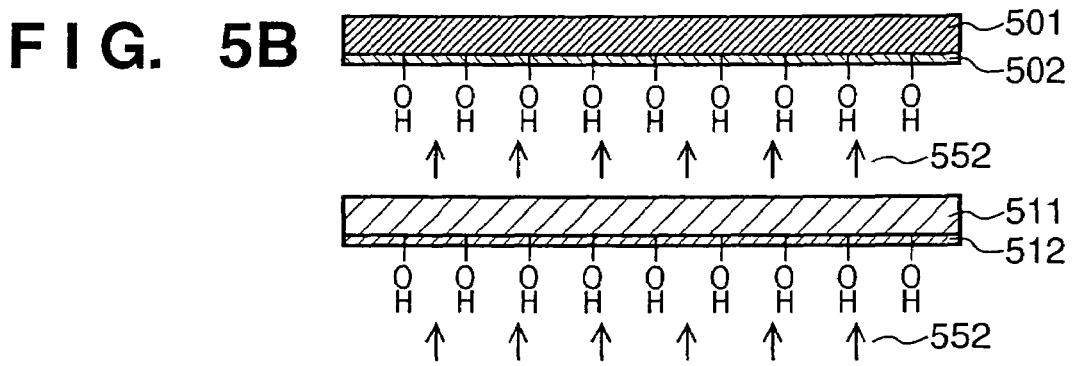
Figure 5C:
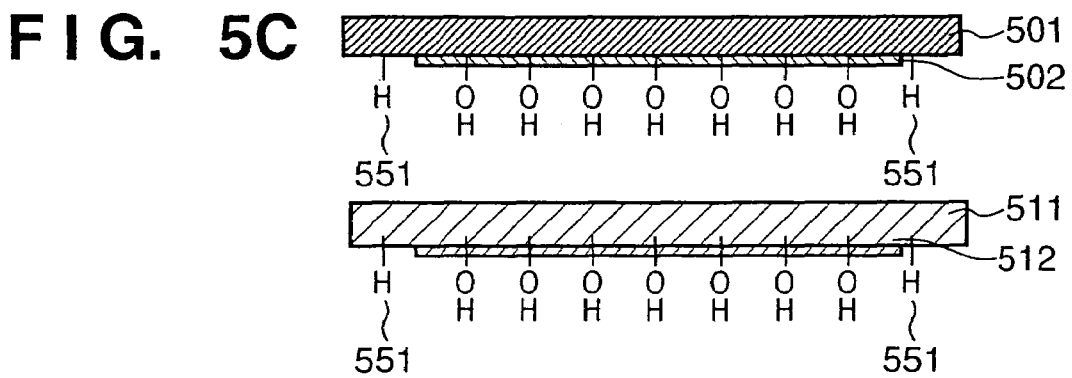

An activation process 552 is executed on one or both of the substrates (FIG. 5B). A periphery 551 of each of the $SiO_2$ film 502 and 512 was etched by a 0.7% hydrofluoric acid solution for 10 min, and the surfaces of the silicon substrates 501 and 511 were exposed at the periphery 551 (at a 2-mm wide periphery in this example) to form the region 551 serving as the hydrophobic surface (FIG. 5C).

Figure 5D:
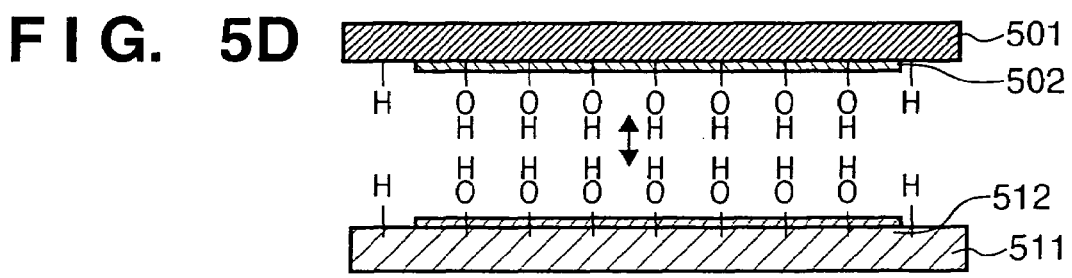

The substrates were bonded to each other. Since the periphery 551 is a hydrophobic surface, the substrates could be bonded without any voids at the periphery 551 (FIG. 5D).

Figure 5E:
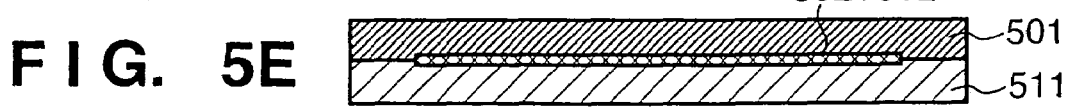

Annealing was executed at 1,000° C. for 130 min to completely bond the silicon substrates 501 and 511 (FIG. 5E).

Figure 5F:
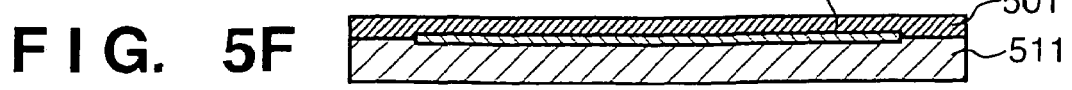

The surface on the side of the silicon substrate 501 was ground 715 μm by using a surface grinder. Next, mirror polishing was executed by using colloidal silica as abrasive grain. An SOI substrate was obtained while leaving the silicon film 501 having a thickness of 2 μm on the $SiO_2$ layers 502 and 512. As a result, the SOI substrate could be obtained without any voids at the periphery 551 (FIG. 5F).

EXAMPLE 6

FIGS. 6A to 6F are sectional views for explaining the steps in Example 6 of an SOI substrate manufacturing method according to this embodiment.

Figure 6A:
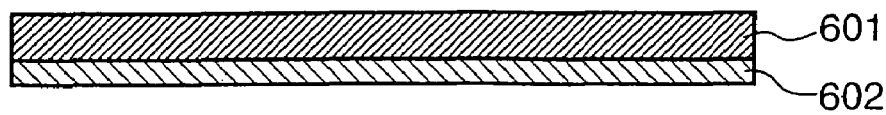
FIGS. 6A to 6F show still another substrate manufacturing method according to the preferred embodiment of the present invention.

A p-type (100) Si substrate 601 having a resistivity of 0.01 Ωcm was used as an silicon substrate 601. After the silicon substrate 601 was cleaned, anodizing was performed. Anodizing was executed in a solution mixture containing a 49% hydrofluoric acid solution and alcohol solution at a ratio of 1:1 for 14 min at a current density of 10 $mA/cm^2$. The thickness of a porous silicon layer 602 was 15 μm (FIG. 6A).

Annealing was executed in an oxygen atmosphere at 400° C. for 60 min to stabilize the surface of the porous silicon layer 602. Silicon was epitaxially grown on the porous silicon layer 602 to form a 1-μm thick epitaxial silicon layer 603. To check the quality of crystal of the epitaxial layer 603, crystal defect evaluation was done by secco etching. However, no defects were observed.

Figure 6B:
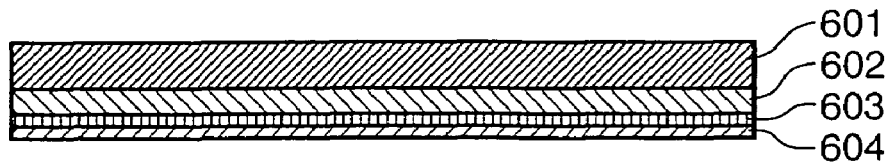

Next, thermal oxidation was executed on the epitaxial silicon layer 603 to be moved, to form a 75-nm thick $SiO_2$ film 604 on the epitaxial silicon layer 603 (FIG. 6B).

Figure 6C:
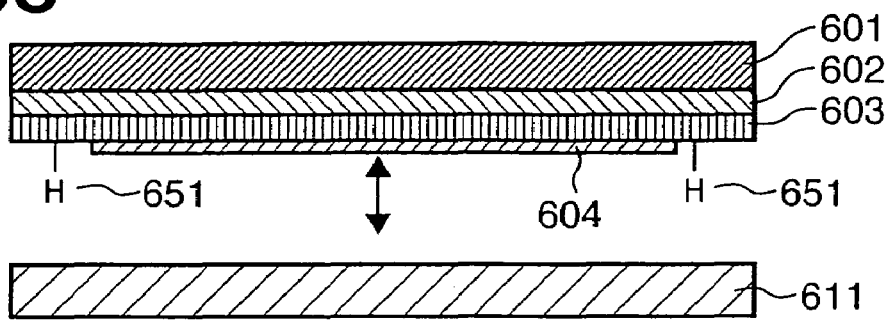

A periphery 651 of the $SiO_2$ film 604 was etched by a 0.7% hydrofluoric acid solution for 10 min, and the surface of the epitaxial silicon layer 603 was exposed at the periphery 651 (at a 2-mm wide periphery in this example) to form the region serving as the hydrophobic surface. Reference numeral 651 denotes a bonding region as the characteristic feature of the present invention (FIG. 6C).

The same effect as described above can be obtained when this process is executed on a silicon substrate side 611 (the bonding method in Example 2), or on the surface after the activating process (the bonding method in Example 3). The process can be applied to the case wherein the $SiO_2$ layer is formed on the silicon substrate side 611 (the bonding methods in Examples 4 and 5).

Figure 6D:
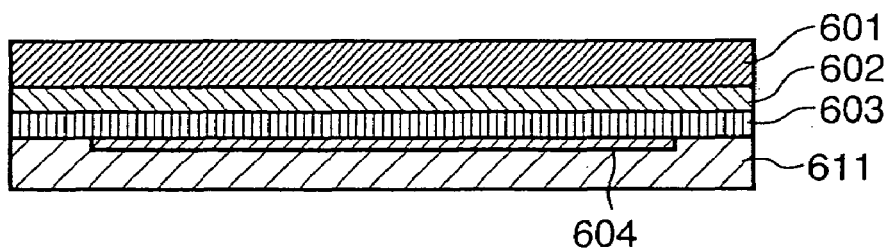

The silicon substrate was bonded to the silicon substrate 611. Since the periphery 651 was a hydrophobic surface, the substrates could be bonded without any voids at the periphery 651 (FIG. 6D).

Figure 6E:
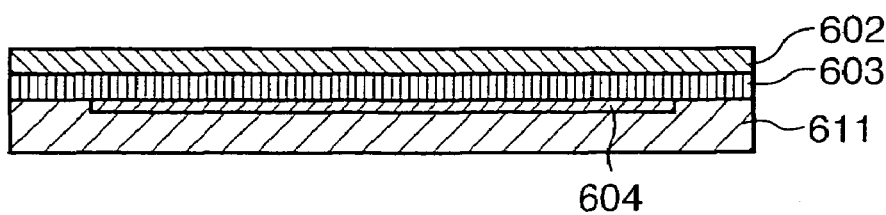

Annealing was executed at 1,000° C. for 130 min to completely bond both substrates. After that, the two wafers were split at the portion of the porous Si layer by using a fluid wedge by water jet. A substrate having a structure including a porous silicon layer, epitaxial silicon layer, thermal oxide film layer, and silicon substrate was obtained (FIG. 6E).

Figure 6F:
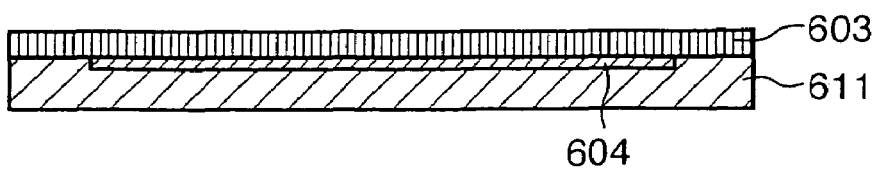

The porous silicon layer 602 was etched by using a solution mixture of hydrofluoric acid solution and hydrogen peroxide solution and applying an ultrasonic wave from the outside. The etching rate difference between the porous silicon layer 602 and the epitaxial silicon layer 603 in this solution is about ×100,000. Hence, the porous silicon layer 602 could be etched without damaging the epitaxial silicon layer 603. In this way, an SOI semiconductor which had the uniform epitaxial silicon layer 603 and had no void at the periphery 651 could be manufactured (FIG. 6F).

EXAMPLE 7

FIGS. 7A to 7E are sectional views for explaining the steps in Example 7 of an SOI substrate manufacturing method according to this embodiment.

Figure 7A:
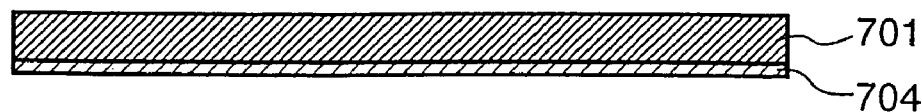
FIGS. 7A to 7E show still another substrate manufacturing method according to the preferred embodiment of the present invention.

A silicon substrate 701 having a thickness of 725 μm was prepared, and thermal oxidation was executed to form a 500-nm thick $SiO_2$ layer 704 on the surface (FIG. 7A).

Figure 7B:
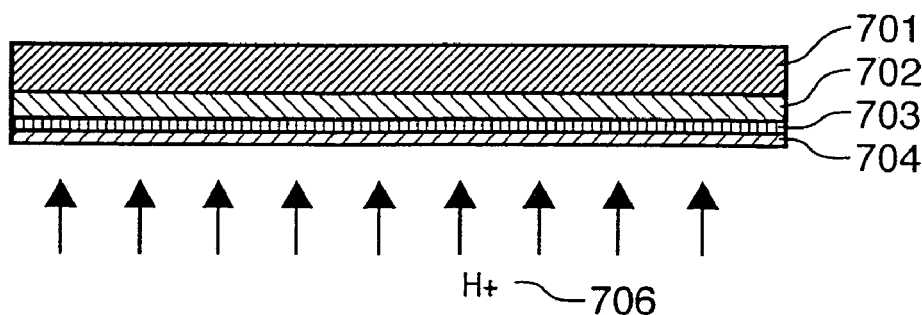

Hydrogen ions 706 were implanted from the surface of the substrate. A micro-bubble layer 702 was formed at a predetermined depth in the silicon substrate 701 by appropriately controlling the acceleration energy of the ions. The surface portion of the silicon substrate 701 changed to a silicon layer 703 (FIG. 7B).

Figure 7C:
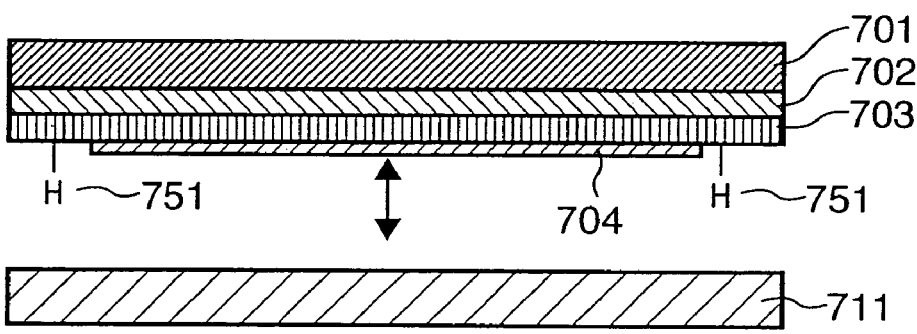

A periphery 751 of the $SiO_2$ film 704 was etched by a 0.7% hydrofluoric acid solution for 10 min, and the surface of the silicon substrate 701 was exposed at the periphery 751 (at a 5-mm wide periphery in this example) to form the region serving as the hydrophobic surface. Reference numeral 751 denotes a bonding region as the characteristic feature of the present invention (FIG. 7C).

The same effect as described above can be obtained even when this process is executed on the silicon substrate side 711 (the bonding method in Example 2), or on the surface after the activating process (the bonding method in Example 3). The process can be applied to the case wherein the $SiO_2$ layer is formed on the silicon substrate side 711 (the bonding methods in Examples 4 and 5).

Figure 7D:
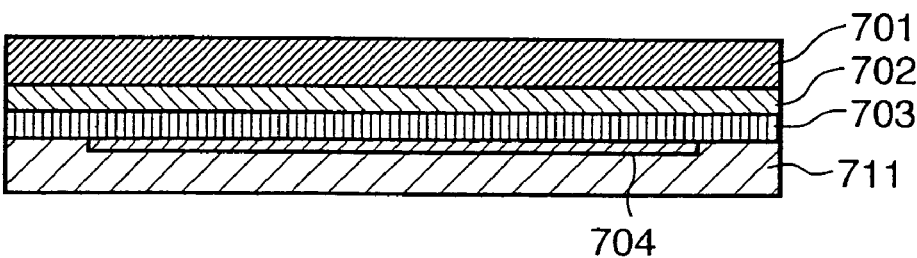

The silicon substrate was bonded to the silicon substrate 711. Since the periphery 751 is a hydrophobic surface, the substrates could be bonded without any voids at the periphery 751 (FIG. 7D).

Figure 7E:
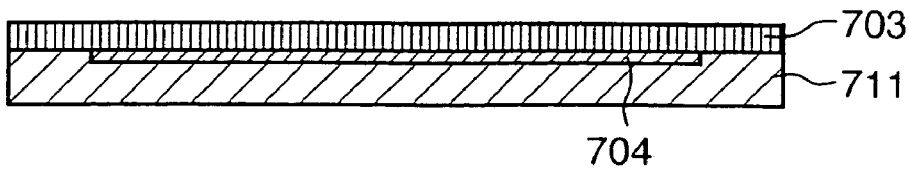

When the bonded substrate stack was subjected to annealing at 450° C. to 550° C., cleavage splitting occurred in the micro-bubble layer 702. Hence, an SOI structure was formed on the side of the support substrate 711 (FIG. 7E). In this way, an SOI substrate which had no void at the periphery 751 could be manufactured (FIG. 7E).

As described above, in the present invention, when the hydrophilic silicon surfaces each having a sufficient bonding strength are bonded to each other, the occurrence of voids (spaces) at the periphery of the wafer can be suppressed, a device manufacturing region can be extended, and the yield of the devices can increase.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-161566 filed on May 31, 2004, which is hereby incorporated by reference herein.

What is claimed is:

1. A substrate manufacturing method of manufacturing a bonded substrate stack by bonding a bonding surface of a first substrate and a bonding surface of a second substrate, comprising steps of:
    partially processing at least one of the bonding surface of the first substrate and the bonding surface of the second substrate to form both a hydrophobic region on an outermost area of at least one of the first and second substrates and a hydrophilic region on a central portion of the at least one of the first and second substrates framed by the hydrophobic region; and bonding the bonding surface of the first substrate and the bonding surface of the second substrate.

2. The method according to claim 1, wherein the bonding surface forming step comprises a step of supplying hydrofluoric acid to at least one of the first substrate and the second substrate.

3. The method according to claim 1, wherein the bonding surface forming step comprises a step of supplying hydrofluoric acid from at least one of a back surface of the first substrate and a back surface of the second substrate, and making hydrofluoric acid reach at least one of a front surface of the first substrate and a front surface of the second substrate.

4. The method according to claim 3, further comprising a step of supplying hydrofluoric acid while rotating at least one of the first substrate and the second substrate.

5. The method according to claim 1, further comprising a step of polishing, after the bonding step, a surface on the first substrate side of the bonded substrate stack.

6. The method according to claim 1, wherein the first substrate includes a separation layer.

7. The method according to claim 6, further comprising steps of forming the separation layer by porosifying a surface of a semiconductor substrate, forming a semiconductor layer on the surface of the separation layer, and forming an insulating layer on a surface of the semiconductor layer.

8. The method according to claim 1, further comprising a step of annealing the bonded substrate stack after the bonding step.

9. The method according to claim 6, wherein the separation layer is an ion implantation layer formed by implanting ions in the first substrate.

10. The method according to claim 6, further comprising a step of splitting the bonded substrate stack at a portion of the separation layer.

11. The method according to claim 1, wherein the bonding surface forming step is performed such that water on the outermost area is pushed out of the substrate stack.

12. The method according to claim 1, wherein the bonding surface forming step is performed such that a bonding reaction rate at the outermost area is lower than that at the center portion of the at least one of the first and second substrates.

* * * * *

UNITED STATES PATENT AND TRADEMARK OFFICE
CERTIFICATE OF CORRECTION

PATENT NO. : 7,396,734 B2
APPLICATION NO. : 11/139567
DATED : July 8, 2008
INVENTOR(S) : Ryuji Moriwaki It is certified that error appears in the above-identified patent and that said Letters Patent is hereby corrected as shown below:

COLUMN 1

Line 56, "Moutread)." should read --Montreal).--.

COLUMN 8

Line 29, "were" should read --was--.

COLUMN 11

Line 23, "of" should read --of:--.

Signed and Sealed this

Twenty-fifth Day of November, 2008

JON W. DUDAS
*Director of the United States Patent and Trademark Office*